(12) United States Patent
Mitake et al.

(10) Patent No.: US 12,513,993 B2
(45) Date of Patent: Dec. 30, 2025

(54) CHIP-TYPE ELECTRONIC COMPONENT

(71) Applicant: TDK Corporation, Tokyo (JP)

(72) Inventors: Yukio Mitake, Tokyo (JP); Takashi Ohtsuka, Tokyo (JP)

(73) Assignee: TDK Corporation, Tokyo (JP)

( * ) Notice: Subject to any disclaimer, the term of this patent is extended or adjusted under 35 U.S.C. 154(b) by 399 days.

(21) Appl. No.: 18/256,301

(22) PCT Filed: Dec. 9, 2021

(86) PCT No.: PCT/JP2021/045266
§ 371 (c)(1),
(2) Date: Jun. 7, 2023

(87) PCT Pub. No.: WO2022/131113
PCT Pub. Date: Jun. 23, 2022

(65) Prior Publication Data
US 2024/0038754 A1 Feb. 1, 2024

(30) Foreign Application Priority Data

Dec. 15, 2020 (JP) .................. 2020-207227

(51) Int. Cl.
*H10D 86/85* (2025.01)
(52) U.S. Cl.
CPC ................... *H10D 86/85* (2025.01)
(58) Field of Classification Search
CPC ........... H10D 86/85; H10D 1/20; H10D 1/692
See application file for complete search history.

(56) References Cited

U.S. PATENT DOCUMENTS

| | | | |
|---|---|---|---|
| 5,650,756 | A | 7/1997 | Hayashi |
| 2016/0307702 | A1 | 10/2016 | Tanaka et al. |

FOREIGN PATENT DOCUMENTS

| | | | |
|---|---|---|---|
| JP | 07-106898 A | 4/1995 |
| JP | 11-103229 A | 4/1999 |
| JP | 11-145754 A | 5/1999 |
| JP | 2016-201517 A | 12/2016 |

OTHER PUBLICATIONS

International Search Report issued in corresponding International Patent Application No. PCT/JP2021/045266, dated Mar. 8, 2022, with English translation.

*Primary Examiner* — Samuel A Gebremariam
(74) *Attorney, Agent, or Firm* — Rimon P.C.

(57) ABSTRACT

To reduce the chip size of a chip-type electronic component including a capacitor and an inductor. A chip-type electronic component includes a capacitor constituted by a lower electrode pattern, an upper electrode pattern, and an insulating layer, an insulating layer covering the capacitor, and an inductor pattern disposed on the insulating layer. The inductor pattern has a section overlapping the capacitor, whereby an auxiliary capacitor is added. The inductor pattern is thus made to partly overlap the capacitor, so that a larger inductance can be obtained with a small chip size. In addition, characteristics can also be improved by auxiliary capacitance.

6 Claims, 10 Drawing Sheets

CHIP-TYPE ELECTRONIC COMPONENT

CROSS REFERENCE TO RELATED APPLICATIONS

This application is the U.S. National Phase under 35 U.S.C. § 371 of International Application No. PCT/JP2021/045266, filed on Dec. 9, 2021, which claims the benefit of Japanese Application No. 2020-207227, filed on Dec. 15, 2020, the entire contents of each are hereby incorporated by reference.

TECHNICAL FIELD

The present disclosure relates to a chip-type electronic component and, more particularly, to a chip-type electronic component including a capacitor and an inductor.

BACKGROUND ART

Patent Document 1 discloses a chip-type electronic component including a capacitor and an inductor. In the chip-type electronic component disclosed in Patent Document 1, a capacitor electrode pattern small in width is provided so as to overlap an inductor pattern to add an auxiliary capacitance to the inductor pattern while suppressing an increase in chip size. A main capacitor is disposed between terminal electrodes in a plan view.

CITATION LIST

Patent Document

[Patent Document 1] JP 2016-201517A

SUMMARY OF THE INVENTION

Problem to be Solved by the Invention

However, in the chip-type electronic component described in Patent Document 1, an area above the main capacitor is not effectively used, so that there may be a case where chip size needs to be increased to obtain a sufficient inductance.

It is therefore an object of the present disclosure to reduce the chip size of a chip-type electronic component including a capacitance and an inductor.

Means for Solving the Problem

A chip-type electronic component according to the present disclosure includes a first terminal electrode and a second terminal electrode, and a first conductor layer, a second conductor layer, and a third conductor layer. The first conductor layer includes a first connection pattern and a second connection pattern disposed at positions overlapping respectively the first terminal electrode and the second terminal electrode, and a first lower electrode pattern disposed between the first connection pattern and the second connection pattern and connected to one of the first terminal electrode and the second terminal electrode. The second conductor layer includes a first upper electrode pattern disposed at a position overlapping the first lower electrode pattern and connected to other one of the first terminal electrode and the second terminal electrode. The first lower electrode pattern and first upper electrode pattern form a first capacitor. The third conductor layer includes a first inductor pattern including one end, the one end being connected to the first terminal electrode. The first inductor pattern includes a first section overlapping the first capacitor and a second section not overlapping the first capacitor.

According to the present disclosure, the first inductor pattern is made to partly overlap the first capacitor, so that a larger inductance can be obtained with small chip size. In addition, an auxiliary capacitance is generated in the first inductor pattern at a portion thereof overlapping the first capacitor, so that characteristics can also be improved by the auxiliary capacitor.

The chip-type electronic component according to the present disclosure may further include a third terminal electrode and a fourth terminal electrode. The first conductor further includes a third connection pattern and a fourth connection pattern disposed at positions overlapping respectively the third terminal electrode and the fourth terminal electrodes, and a second lower electrode pattern disposed between the third connection pattern and the fourth connection pattern and connected to one of the third terminal electrode and the fourth terminal electrode. The second conductor layer further includes a second upper electrode pattern disposed at a position overlapping the second lower electrode pattern and connected to other one of the third terminal electrode and the fourth terminal electrode. The second lower electrode pattern and the second upper electrode pattern form a second capacitor. The third conductor layer further includes a second inductor pattern including one end, the one end being connected to the first terminal electrode. The other end of the first inductor pattern is connected to the third terminal electrode. The other end of the second inductor pattern is connected to the fourth terminal electrode. With this configuration, there can be obtained a splitter circuit with one of the first and second terminal electrodes used as an input terminal and the third and fourth terminal electrodes used as a pair of output terminals.

In the present disclosure, the second section of the first inductor pattern may be partly disposed between the first connection pattern and the third connection pattern or between the second connection pattern and the fourth connection pattern. This allows more effective use of the third conductor layer, making it possible to reduce chip size.

In the present disclosure, the second inductor pattern may include a third section overlapping the second capacitor and a fourth section not overlapping the second capacitor. This allows more effective use of the third conductor layer, making it possible to reduce chip size. In addition, an auxiliary capacitance is generated in the second inductor pattern at a portion thereof overlapping the second capacitor, so that characteristics can also be improved by the auxiliary capacitor.

In the present disclosure, the fourth section of the second inductor pattern may be partly disposed between the first connection pattern and the third connection pattern or between the second connection pattern and the fourth connection pattern. This allows more effective use of the third conductor layer, making it possible to reduce chip size.

Advantageous Effects of the Invention

As described above, according to the present disclosure, chip size of a chip-type electronic component including a capacitor and an inductor can be reduced.

MODE FOR CARRYING OUT THE INVENTION

Hereinafter, preferred embodiments of the present disclosure will be described in detail with reference to the accompanying drawings.

Figure 1:
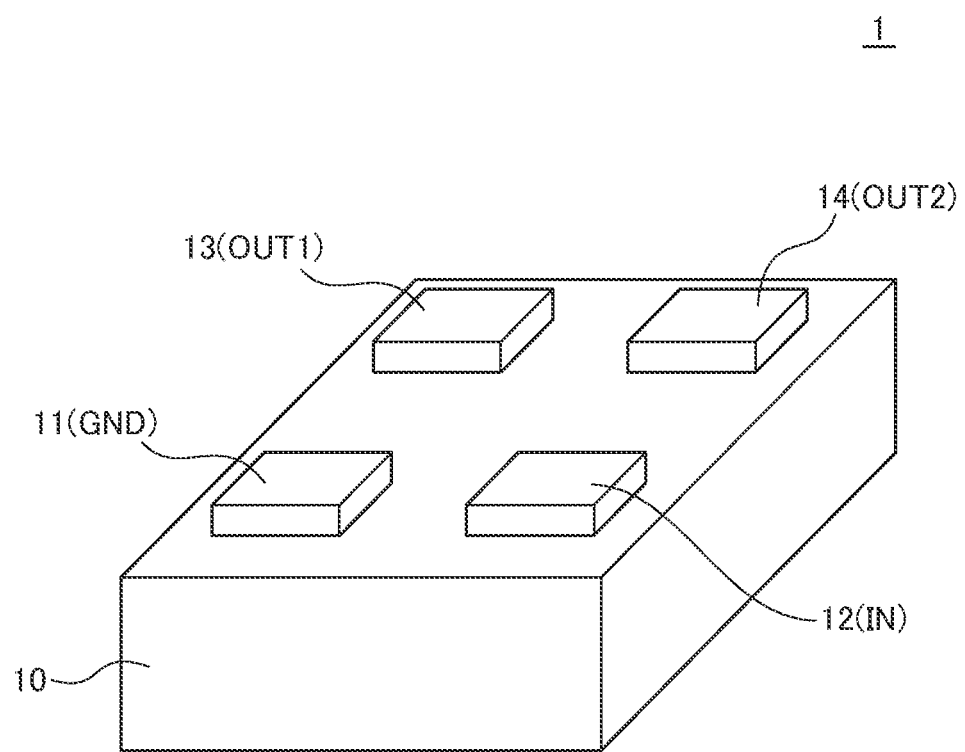
FIG. 1 is a schematic perspective view illustrating the outer appearance of a chip-type electronic component 1 according to one embodiment of the present disclosure.
Figure 2:
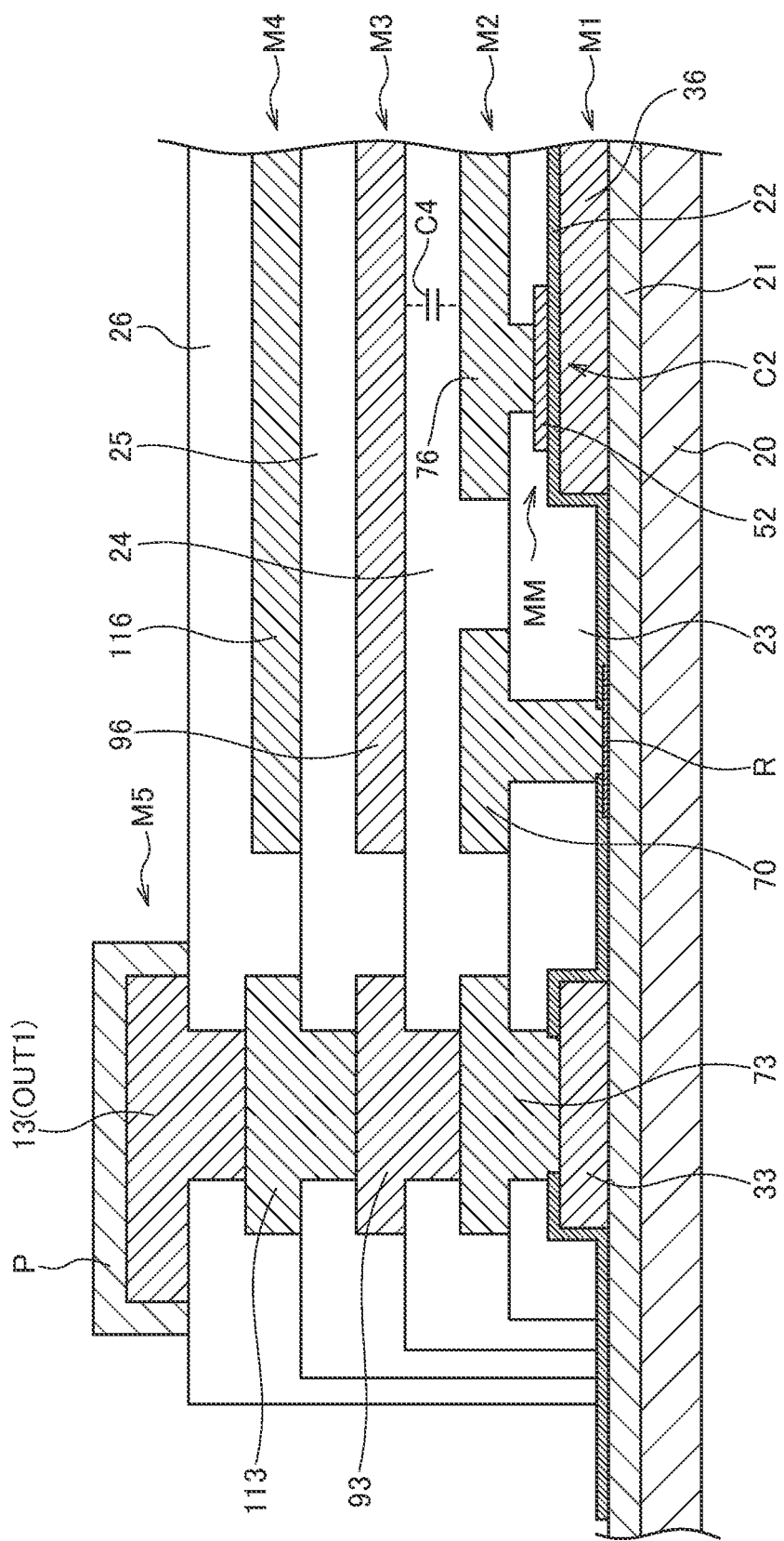
FIG. 2 is a schematic partial cross-sectional view of the chip-type electronic component 1.

FIG. 1 is a schematic perspective view illustrating the outer appearance of a chip-type electronic component 1 according to one embodiment of the present disclosure. FIG. 2 is a schematic partial cross-sectional view of the chip-type electronic component 1.

The chip-type electronic component 1 according to the present embodiment is a splitter for distributing a high-frequency signal into two and includes a main body part 10 and terminal electrodes 11 to 14 formed on the main body part 10, as illustrated in FIG. 1. The terminal electrodes 11 to 14 are disposed at four corners of the surface of the main body part 10. As illustrated in FIG. 2, the main body part 10 includes a substrate 20, a planarization layer 21 covering the surface of the substrate 20, conductor layers M1, MM, M2, M3, M4, and M5 made of, e.g., Cu and provided on the planarization layer 21, insulating layers 22 to 26, and a resistance pattern R. The material of the substrate 20 may be any material as long as it is chemically and thermally stable with less stress and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The planarization layer 21 may be made of, e.g., alumina or silicon oxide.

Figure 3:
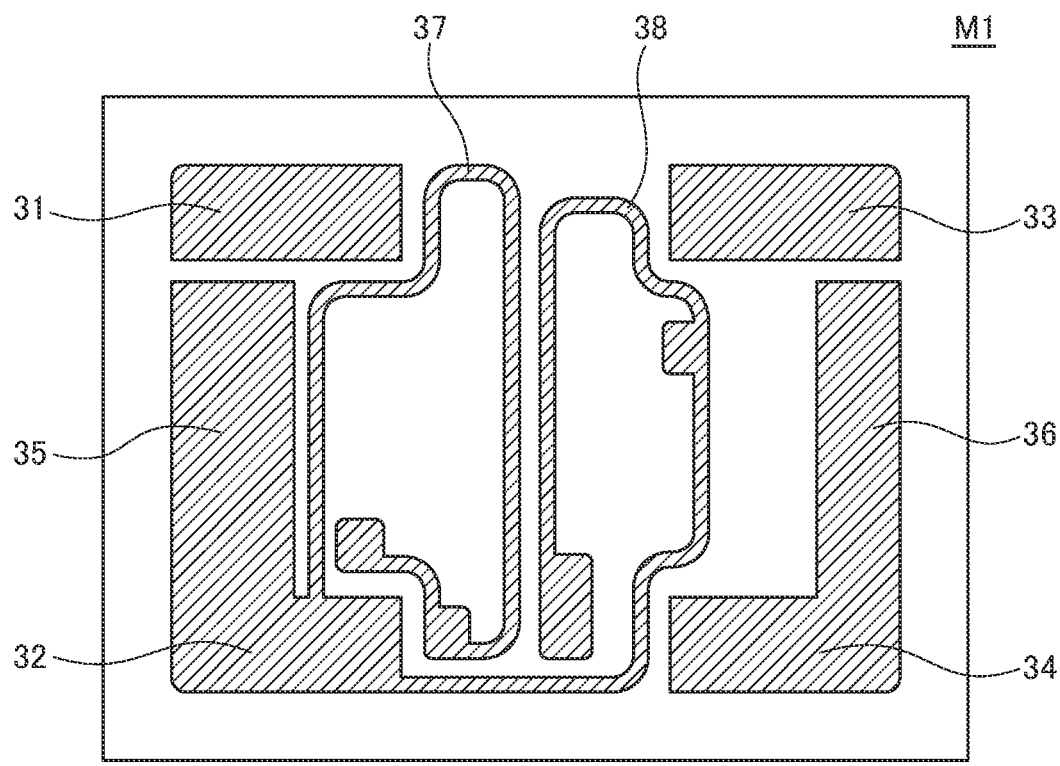
FIG. 3 is a plan view for explaining a pattern shape of a conductor layer M1.

The conductor layer M1 is a layer positioned in the lowermost layer and includes connection patterns 31 to 34, lower electrode patterns 35, 36, and inductor patterns 37, 38, as illustrated in FIG. 3. The connection patterns 31 to 34 are disposed at positions overlapping respectively the terminal electrodes 11 to 14. The lower electrode pattern 35 is disposed between the connection patterns 31 and 32 and connected to the connection pattern 32. The lower electrode pattern 36 is disposed between the connection patterns 33 and 34 and connected to the connection pattern 34. The inductor patterns 37 and 38 are each a pattern wound in about one turn and are connected at one ends thereof to the connection pattern 32. The inductor pattern 37 partly meanders along the connection patterns 31, 32 and lower electrode patterns 35, and the inductor pattern 38 partly meanders along the connection patterns 33, 34 and lower electrode patterns 36. The inductor pattern 37 includes a section positioned between the connection patterns 31 and 32, a section positioned between the connection patterns 31 and 33, and a section positioned between the connection patterns 32 and 34. Similarly, the inductor pattern 38 includes a section positioned between the connection patterns 33 and 34, a section positioned between the connection patterns 31 and 33, and a section positioned between the connection patterns 32 and 34.

Figure 4:
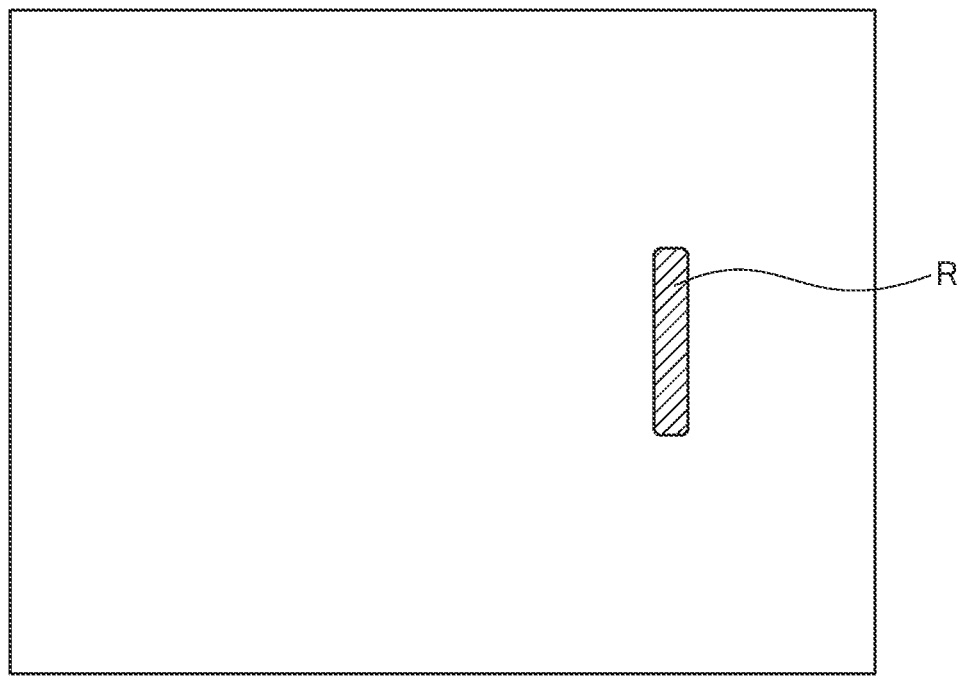
FIG. 4 is a plan view for explaining a pattern shape of a resistance layer R.

The resistance pattern R is provided in the same layer as the conductor layer M1. As illustrated in FIG. 4, the resistance layer R is disposed between the connection patterns 33 and 34.

Figure 5:
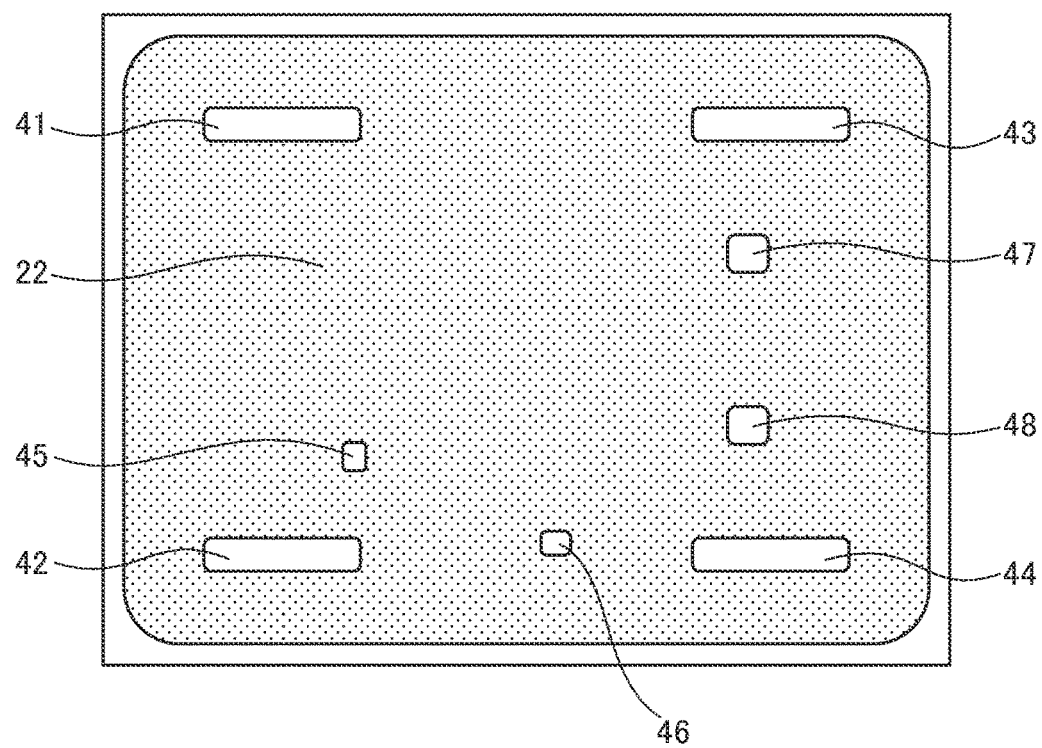
FIG. 5 is a plan view for explaining a pattern shape of an insulating layer 22.

The conductor layer M1 is covered with the insulating layer 22. The insulating layer 22 is a thin film made of an inorganic insulating material such as silicon nitride and constitutes a capacitive insulating film of a capacitor. As illustrated in FIG. 5, the insulating layer 22 has openings 41 to 48. The openings 41 to 44 are formed at positions exposing respectively the connection patterns 31 to 34, the openings 45 and 46 are formed at positions exposing respectively the other ends of the inductor patterns 37 and 38, and the openings 47 and 48 are formed at positions exposing respectively both ends of the resistance pattern R.

Figure 6:
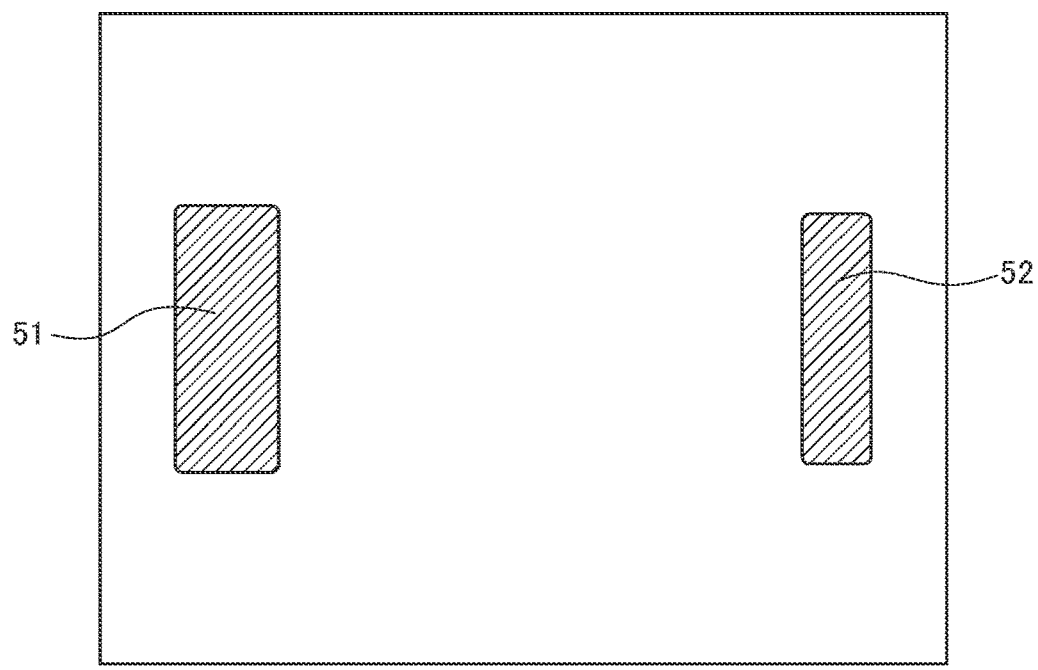
FIG. 6 is a plan view for explaining a pattern shape of a conductor layer MM.

The conductor layer MM is provided on the insulating layer 22. As illustrated in FIG. 6, the conductor layer MM includes upper electrode patterns 51 and 52. The upper electrode patterns 51 and 52 are provided at positions overlapping respectively the lower electrode patterns 35 and 36. As a result, the lower electrode pattern 35, upper electrode pattern 51, and insulating layer 22 constitute a first capacitor, and the lower electrode pattern 36, upper electrode pattern 52, and insulating layer 22 constitute a second capacitor.

Figure 7:
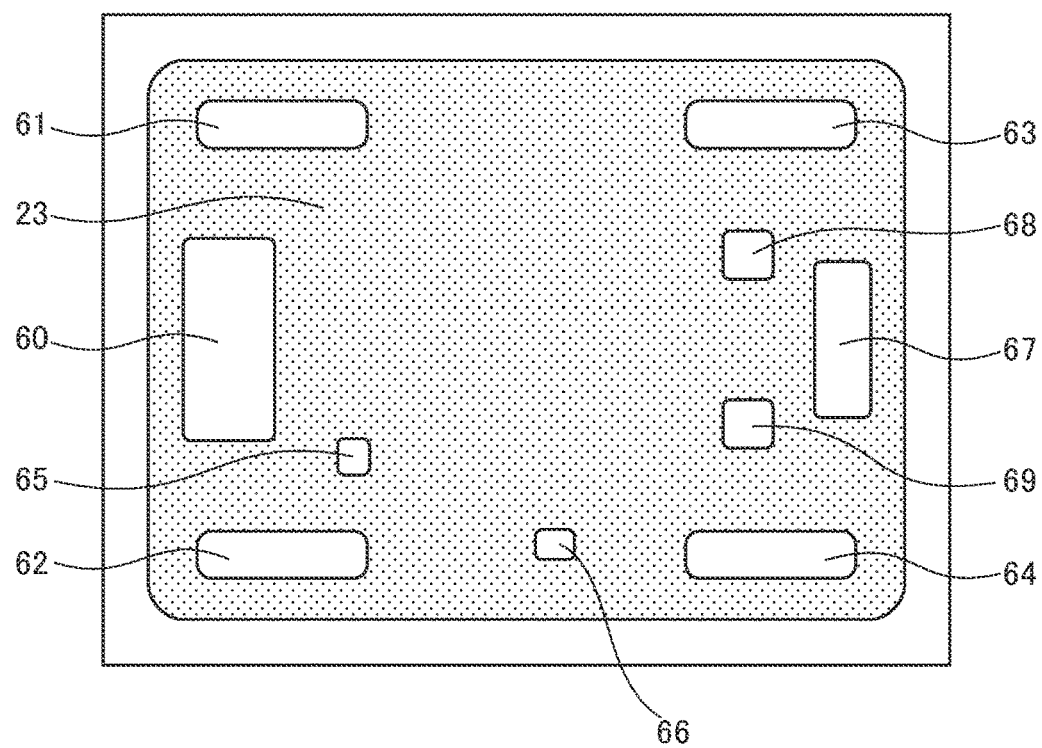
FIG. 7 is a plan view for explaining a pattern shape of an insulating layer 23.

The conductor layer MM is covered with an insulating layer 23 made of a resin material such as polyimide. As illustrated in FIG. 7, the insulating layer 23 has openings 60 to 69. The openings 61 to 64 are formed at positions exposing respectively the connection patterns 31 to 34 through the respective openings 41 to 44, the openings 65 and 66 are formed at positions exposing respectively the other ends of the inductor patterns 37 and 38 through the respective openings 45 and 46, the openings 60 and 67 are formed at positions exposing respectively the upper electrode patterns 51 and 52, and the openings 68 and 69 are formed at positions exposing respectively the both ends of the resistance pattern R through the respective openings 47 and 48.

Figure 8:
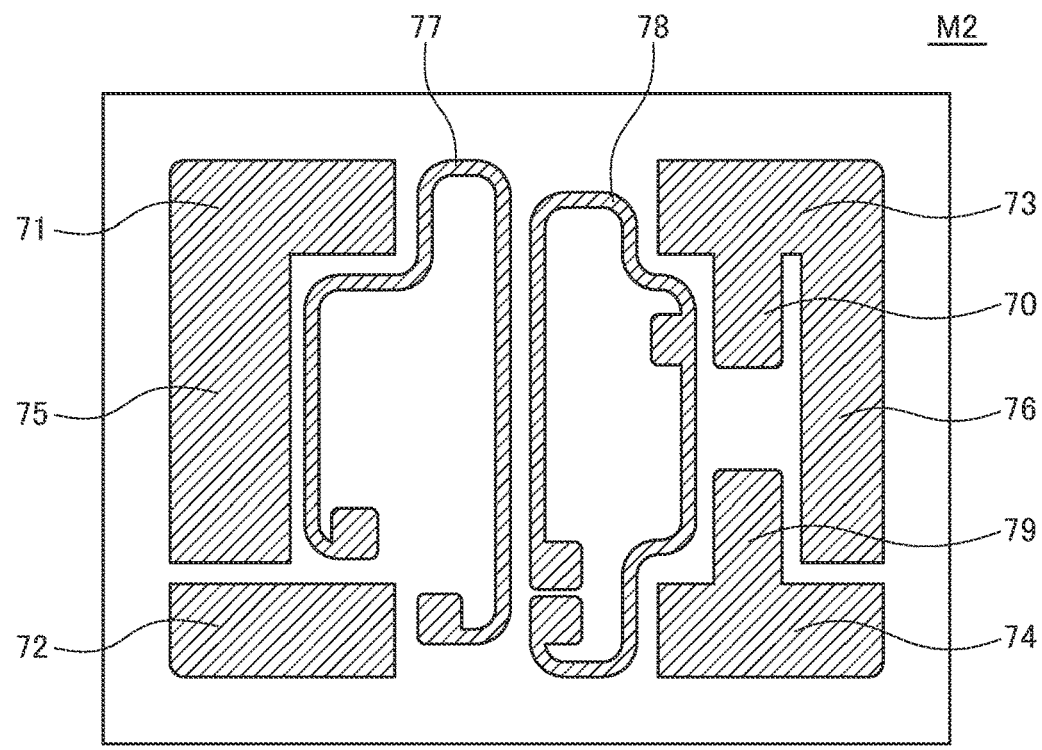
FIG. 8 is a plan view for explaining a pattern shape of a conductor layer M2.

The conductor layer M2 is provided on the insulating layer 23. As illustrated in FIG. 8, the conductor layer M2 includes connection patterns 70 to 76, 79, and inductor patterns 77, 78. The connection patterns 71 to 74 are provided at positions overlapping respectively the terminal electrodes 11 to 14 and connected respectively to the connection patterns 31 to 34 through the respective openings 61 to 64 and respective openings 41 to 44. The connection patterns 75 and 76 are connected respectively to the upper electrode patterns 51 and 52 through the respective openings 60 and 67. The connection patterns 70 and 79 are connected respectively to the both ends of the resistance pattern R through the respective openings 68 and 69 and respective openings 47 and 48. One ends of the inductor patterns 77 and 78 are connected respectively to the other ends of the inductor patterns 37 and 38 through the respective openings 65 and 66 and respective openings 45 and 46. The inductor patterns 77 and 78 are each a pattern wound in about one turn. The inductor pattern 77 partly meanders along the connection patterns 71, 72, and 75, and the inductor pattern 78 partly meanders along the connection patterns 70, 73, 74, and 79. The inductor pattern 77 includes a section positioned between the connection patterns 71 and 72, a section positioned between the connection patterns 71 and 73, and a section positioned between the connection patterns 72 and 74. Similarly, the inductor pattern 78 includes a section positioned between the connection patterns 73 and 74, a section positioned between the connection patterns 71 and 73, and a section positioned between the connection patterns 72 and 74.

Figure 9:
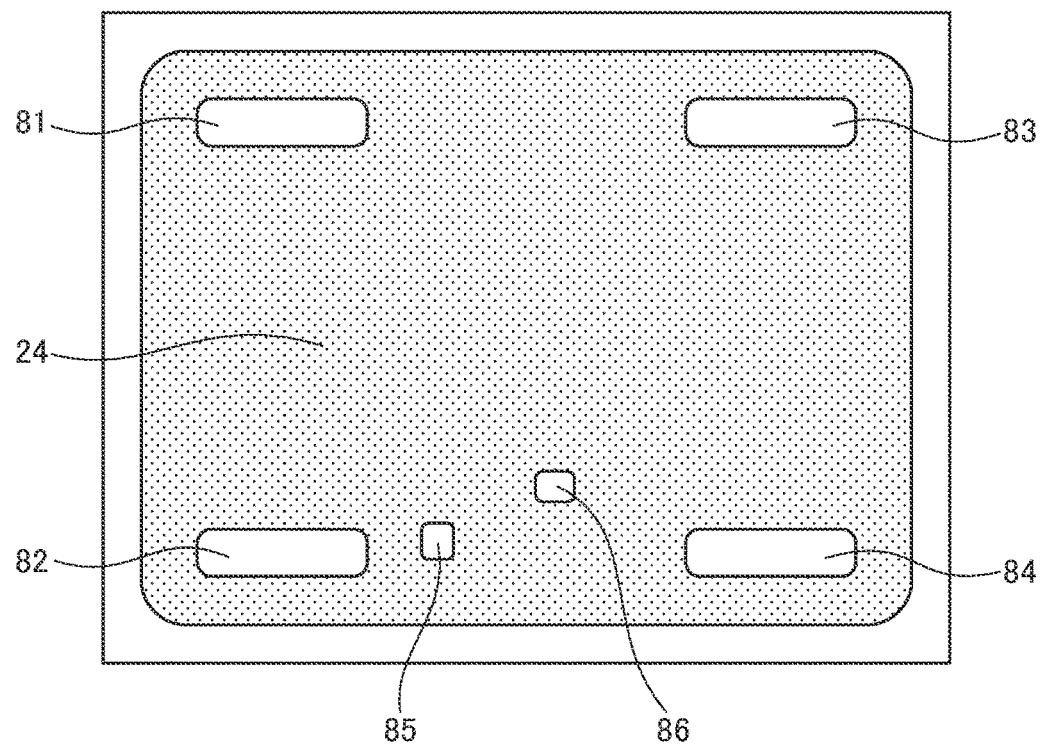
FIG. 9 is a plan view for explaining a pattern shape of an insulating layer 24.

The conductor layer M2 is covered with an insulating layer 24 made of a resin material such as polyimide. As illustrated in FIG. 9, the insulating layer 24 has openings 81 to 86. The openings 81 to 84 are formed at positions exposing respectively the connection patterns 71 to 74, and the openings 85 and 86 are formed at positions exposing respectively the other ends of the inductor patterns 77 and 78.

Figure 10:
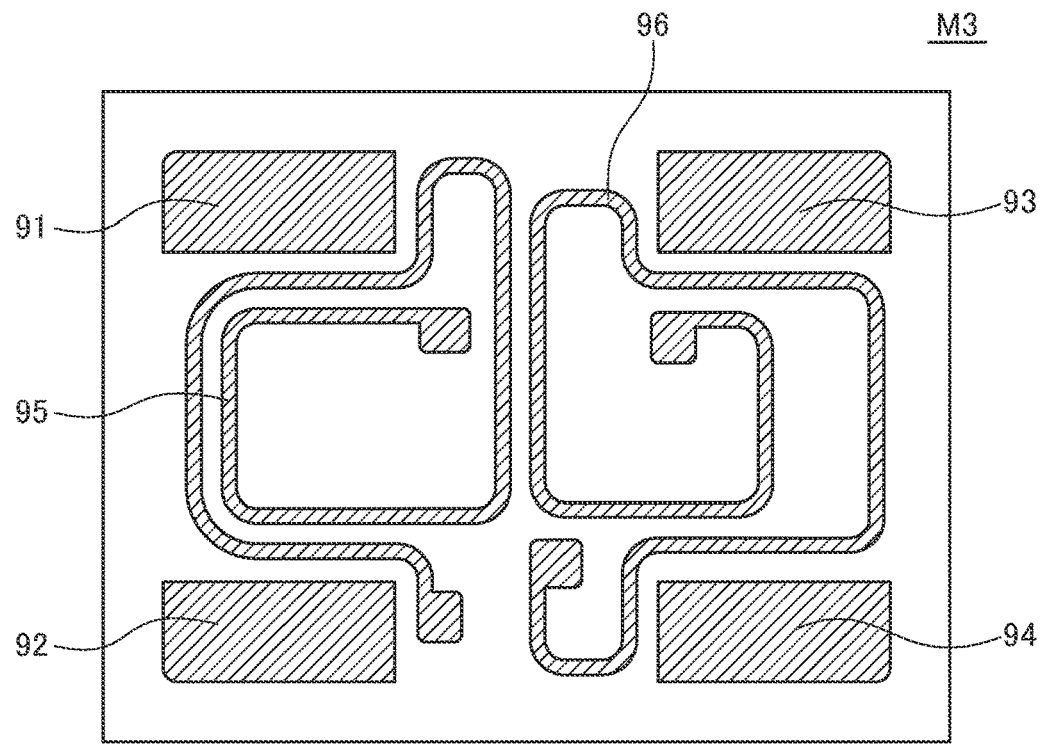
FIG. 10 is a plan view for explaining a pattern shape of a conductor layer M3.

The conductor layer M3 is provided on the insulating layer 24. As illustrated in FIG. 10, the conductor layer M3 includes connection patterns 91 to 94 and inductor patterns 95 and 96. The connection patterns 91 to 94 are provided at positions overlapping respectively the terminal electrodes 11 to 14 and connected respectively to the connection patterns 71 to 74 through the respective openings 81 to 84. One ends of the inductor patterns 95 and 96 are connected respectively to the other ends of the inductor patterns 77 and 78 through the respective openings 85 and 86. The inductor patterns 95 and 96 are each a pattern wound in about 1.5 turns. The inductor pattern 95 partly meanders along the connection patterns 91 and 92, and the inductor pattern 96 partly meanders along the connection patterns 93 and 94. The inductor pattern 95 includes a section positioned between the connection patterns 91 and 92, a section positioned between the connection patterns 91 and 93, and a section positioned between the connection patterns 92 and 94. Similarly, the inductor pattern 96 includes a section positioned between the connection patterns 93 and 94, a section positioned between the connection patterns 91 and 93, and a section positioned between the connection patterns 92 and 94.

The inductor pattern 95 partly overlaps the first capacitor and connection pattern 75 at the section positioned between the connection patterns 91 and 92, while the remaining sections thereof do not overlap the first capacitor and connection pattern 75. Similarly, the inductor pattern 96 partly overlaps the second capacitor and connection pattern 76 at the section positioned between the connection patterns 93 and 94, while the remaining sections thereof do not overlap the second capacitor and connection pattern 76.

Figure 11:
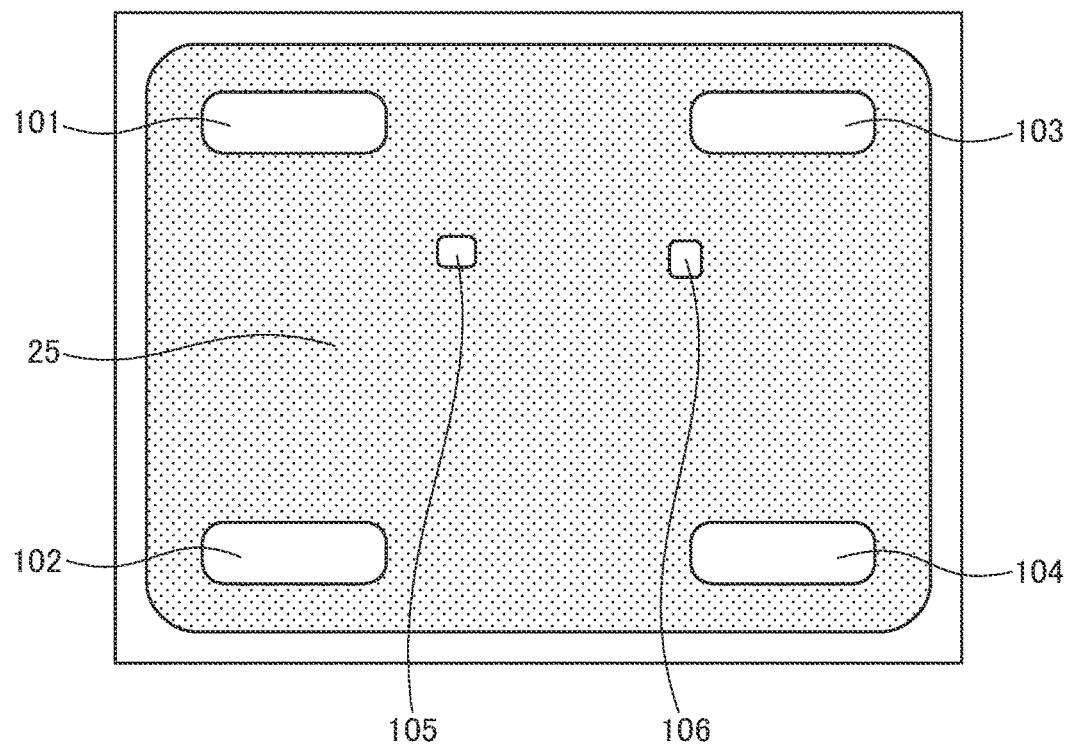
FIG. 11 is a plan view for explaining a pattern shape of an insulating layer 25.

The conductor layer M3 is covered with an insulating layer 25 made of a resin material such as polyimide. As illustrated in FIG. 11, the insulating layer 25 has openings 101 to 106. The openings 101 to 104 are formed at positions exposing respectively the connection patterns 91 to 94, and the openings 105 and 106 are formed at positions exposing respectively the other ends of the inductor patterns 95 and 96.

Figure 12:
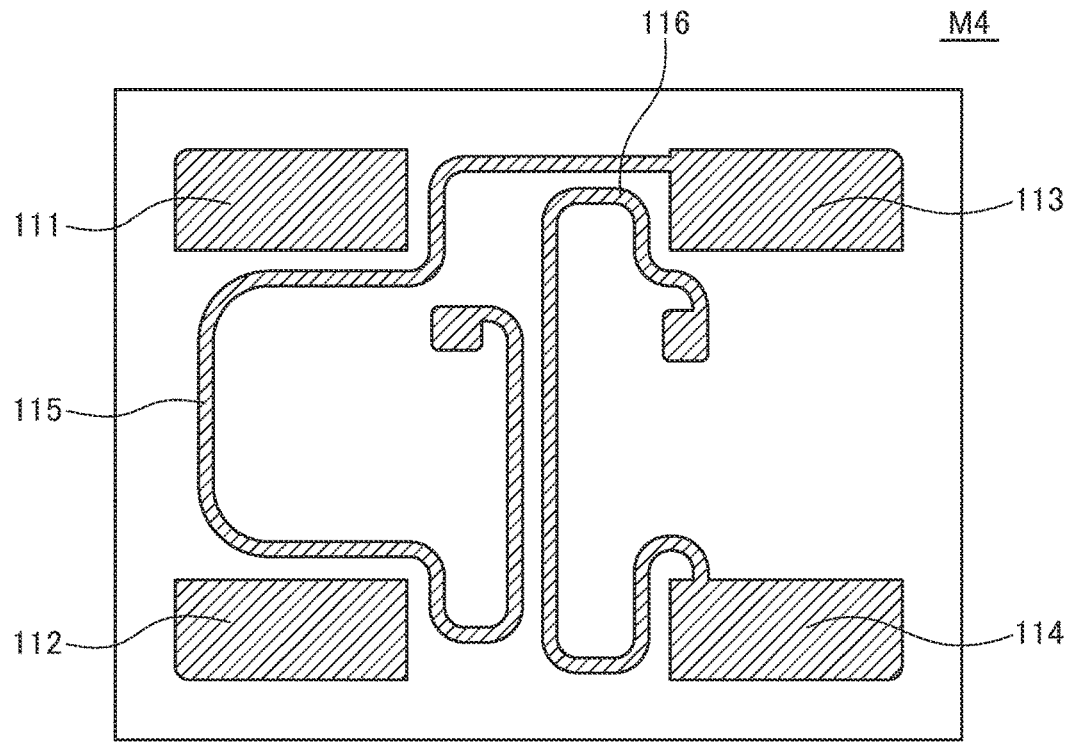
FIG. 12 is a plan view for explaining a pattern shape of a conductor layer M4.

The conductor layer M4 is provided on the insulating layer 25. As illustrated in FIG. 12, the conductor layer M4 includes connection patterns 111 to 114, and inductor patterns 115, 116. The connection patterns 111 to 114 are provided at positions overlapping respectively the terminal electrodes 11 to 14 and connected respectively to the connection patterns 91 to 94 through the respective openings 101 to 104. One ends of the inductor patterns 115 and 116 are connected respectively to the other ends of the inductor patterns 95 and 96 through the respective openings 105 and 106. The other ends of the inductor patterns 115 and 116 are connected respectively to the connection patterns 113 and 114. The inductor patterns 115 and 116 are each a pattern wound in about one turn. The inductor pattern 115 partly meanders along the connection patterns 111 and 112. The inductor pattern 115 includes a section positioned between the connection patterns 111 and 112, a section positioned between the connection patterns 111 and 113, and a section positioned between the connection patterns 112 and 114. Similarly, the inductor pattern 116 includes a section positioned between the connection patterns 113 and 114, a section positioned between the connection patterns 111 and 113, and a section positioned between the connection patterns 112 and 114.

Figure 13:
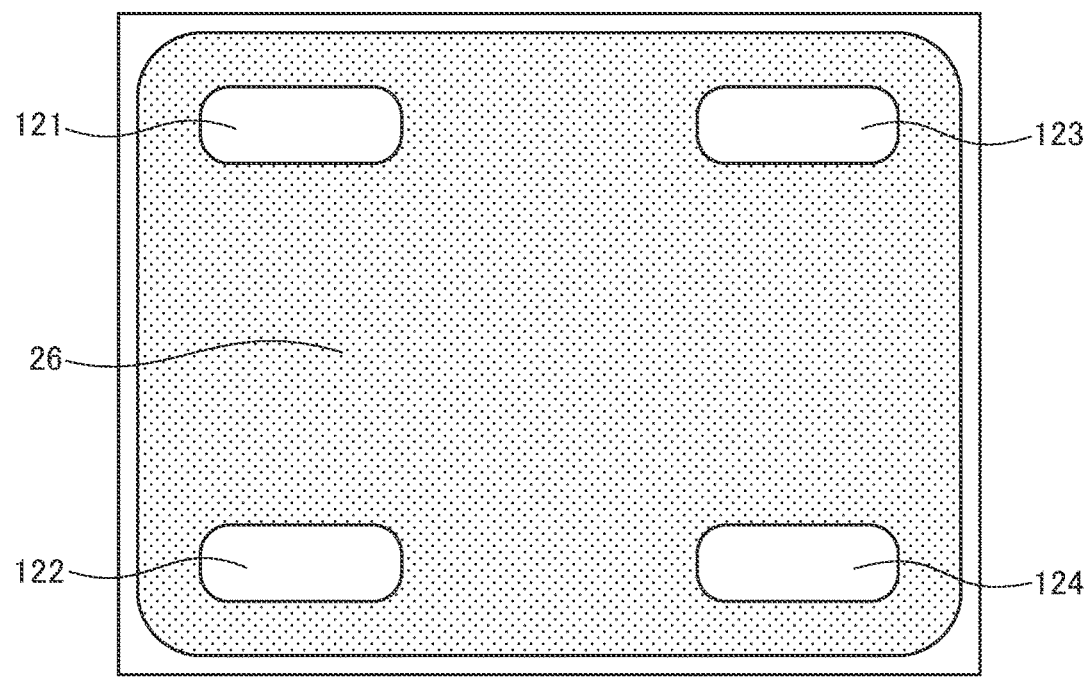
FIG. 13 is a plan view for explaining a pattern shape of an insulating layer 26.

The conductor layer M4 is covered with an insulating layer 26 made of a resin material such as polyimide. As illustrated in FIG. 13, the insulating layer 26 has openings 121 to 124. The openings 121 to 124 are formed at positions exposing respectively the connection patterns 111 to 114.

Figure 14:
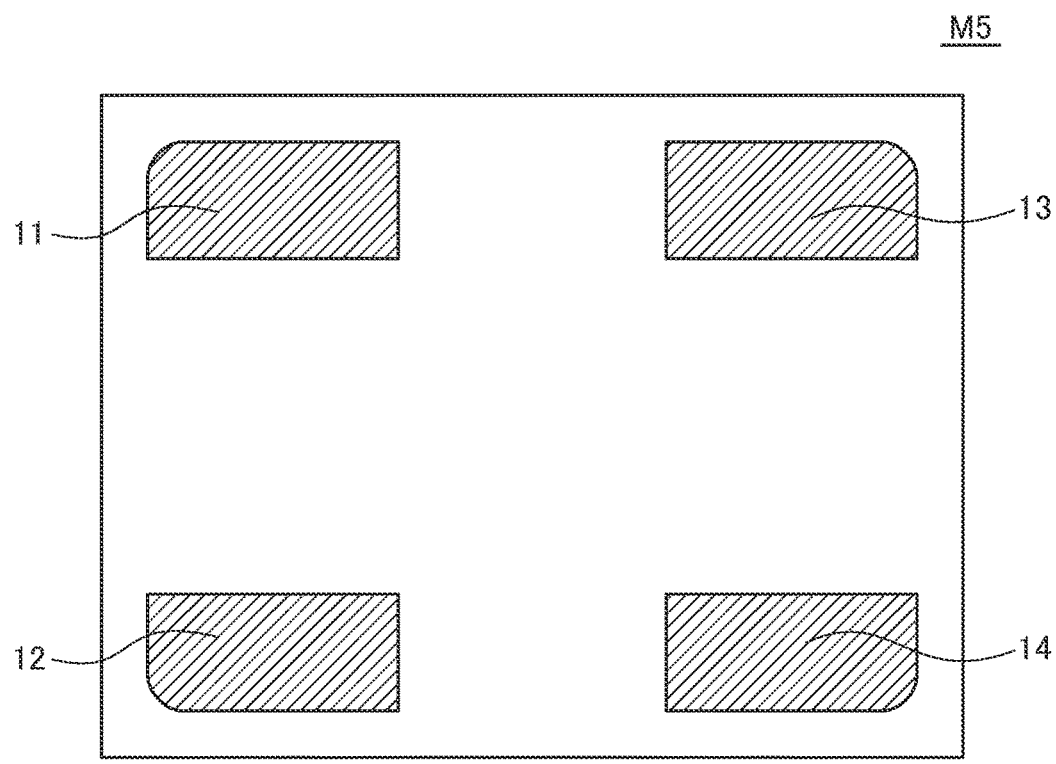
FIG. 14 is a plan view for explaining a pattern shape of a conductor layer M5.

The conductor layer M5 is provided on the insulating layer 26. As illustrated in FIG. 14, the conductor layer M5 includes the terminal electrodes 11 to 14. The terminal electrodes 11 to 14 are connected respectively to the connection patterns 111 to 114 through the respective openings 121 to 124. The surfaces of the terminal electrodes 11 to 14 may be covered with a plated film P made of Ni and Au as illustrated in FIG. 2.

Figure 15:
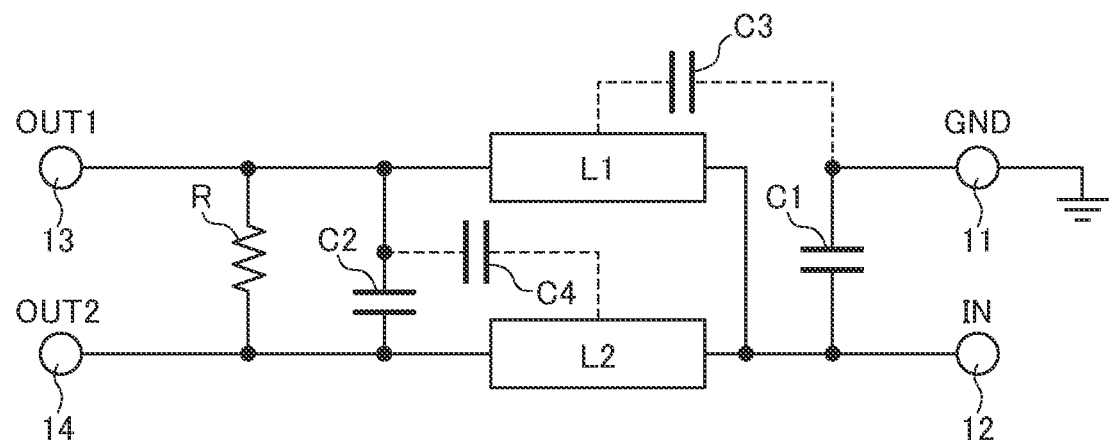
FIG. 15 is an equivalent circuit diagram of the chip-type electronic component 1.

With the configuration described above, the chip-type electronic component 1 according to the present embodiment constitutes a splitter circuit illustrated in FIG. 15. In actual use, the terminal electrode 11 is grounded to a ground GND, the terminal electrode 12 is input with an input signal, and the terminal electrodes 13 and 14 each output an output signal. The first capacitor C1 connected between the terminal electrodes 11 and 12 is constituted by the lower electrode pattern 35, upper electrode pattern 51, and insulating layer 22. The second capacitor C2 connected between the terminal electrodes 13 and 14 is constituted by the lower electrode pattern 36, upper electrode pattern 52, and insulating layer 22. The resistance pattern R is also connected between the terminal electrodes 13 and 14. A first inductor L1 connected between the terminal electrodes 12 and 13 is constituted by the inductor patterns 37, 77, 95, and 115. A second inductor L2 connected between the terminal electrodes 12 and 14 is constituted by the inductor patterns 38, 78, 96, and 116.

Further, in the chip-type electronic component 1 according to the present embodiment, the inductor pattern positioned in the conductor layer M3 partly overlaps the connection pattern 75 positioned in the conductor layer M2. Thus, a capacitance is generated between the inductor pattern 95 and the connection pattern 75. That is, as illustrated in FIG. 15, an auxiliary third capacitor C3 is added between the terminal electrode 11 and the first inductor L1. Similarly, the inductor pattern 96 positioned in the conductor layer M3 partly overlaps the connection pattern 76 positioned in the conductor layer M2. Thus, a capacitance is generated between the inductor pattern 96 and the connection pattern 76. That is, as illustrated in FIG. 15, an auxiliary fourth capacitor C4 is added between the terminal electrode 13 and the second inductor L2. The insulating layer 24 separating the conductor layers M2 and M3 is significantly thicker than the insulating layer 22 as a capacitive insulating film, so that, although the capacitances of the third and fourth capacitors C3 and C4 are quite small, addition of such capacitors C3 and C4 improves various characteristics described later.

Figure 16:
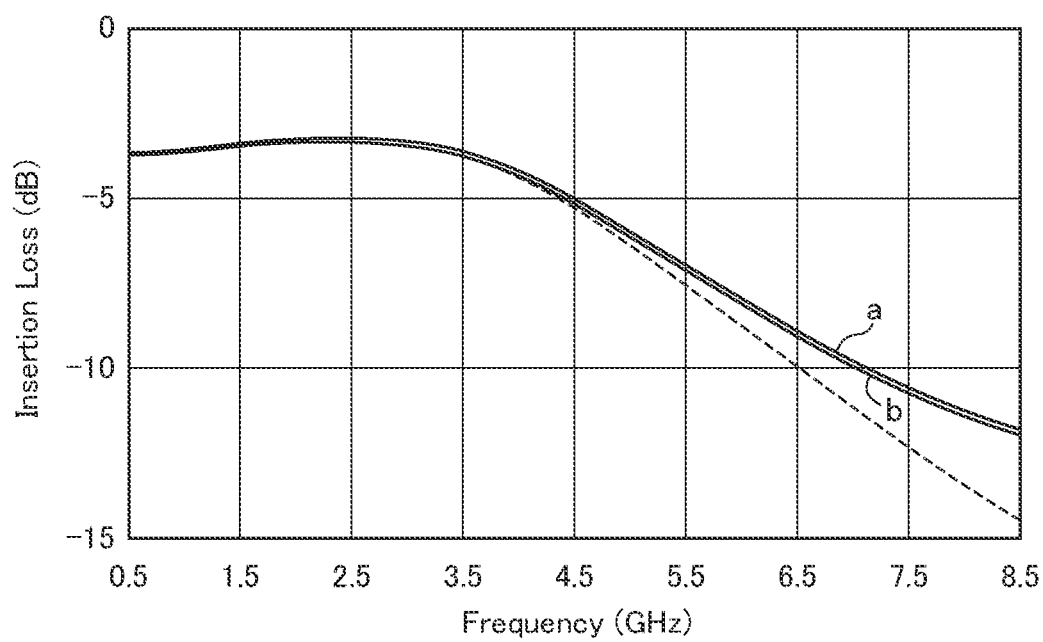
FIG. 16 is a graph illustrating an insertion loss of the chip-type electronic component 1.
Figure 17:
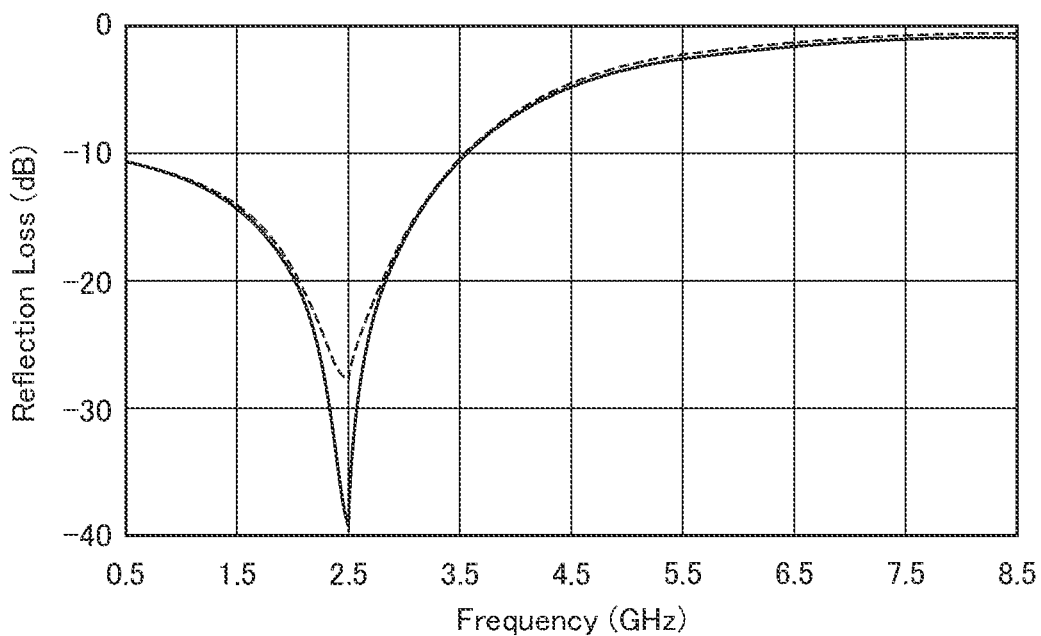
FIG. 17 is a graph illustrating a reflection loss of the chip-type electronic component 1.
Figure 18:
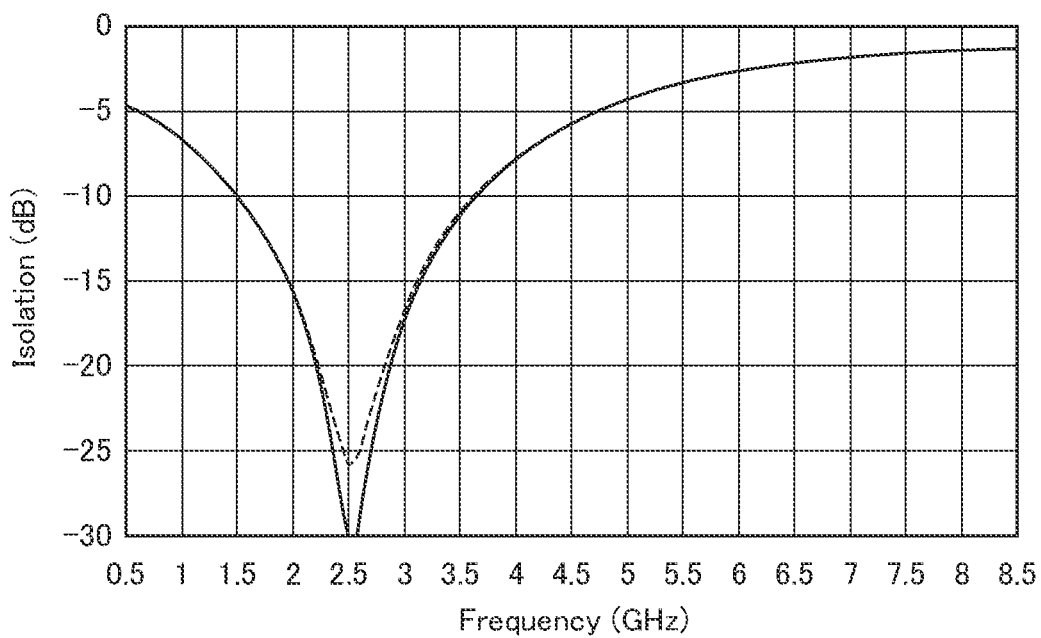
FIG. 18 is a graph illustrating an isolation of the chip-type electronic component 1.

FIGS. 16 to 18 are graphs illustrating an insertion loss, a reflection loss, and an isolation, respectively. In these graphs, a solid line denotes characteristics of the chip-type electronic component 1 according to the present embodiment, and a dashed line denotes characteristics of the chip-type electronic component 1 in the absence of the third and fourth capacitors C3 and C4. The insertion loss refers to a loss generated when a signal input to the terminal electrode 12 is output from the terminal electrodes 13 and 14. The reflection loss refers to a component of a signal input to the terminal electrode 13 that is reflected on the terminal electrode 12. The isolation is an isolation between the terminal electrodes 13 and 14. As can be seen from FIGS. 16 to 18, addition of the third and fourth capacitors C3 and C4 improves the insertion loss, reflection loss, and isolation.

As described above, in the chip-type electronic component 1 according to the present embodiment, the inductor patterns 95 and 96 overlap the capacitors C1 and C2, respectively, whereby the auxiliary third and fourth capacitors C3 and C4 are added, thereby allowing various characteristics required for the splitter to be improved. In addition, the section of the inductor pattern 95 that is positioned between its adjacent connection patterns 91 and 92 meanders along the connection patterns 91 and 92 and overlaps the capacitor C1, and the section of the inductor pattern 96 that is positioned between its adjacent connection patterns 93 and 94 meanders along the connection patterns 93 and 94 and overlaps the capacitor C2, making it possible to increase the wiring length of the inductor patterns 95 and 96. Thus, it is possible to reduce chip size while achieving a required inductance.

While the preferred embodiment of the present disclosure has been described, the present disclosure is not limited to the above embodiment, and various modifications may be made within the scope of the present disclosure, and all such modifications are included in the present disclosure.

For example, although the third capacitor C3 and the fourth capacitor C4 are added in the above embodiment, this is not essential in the present disclosure, and in some embodiment, only the third capacitor C3 may be added.

REFERENCE SIGNS LIST 1 chip-type electronic component
10 main body part
11-14 terminal electrode
20 substrate
21 planarization layer
22-26 insulating layer
23 insulating layer
24 insulating layer
25 insulating layer
26 insulating layer
31 connection pattern
31-34 connection pattern
35, 36 lower electrode pattern
36 lower electrode pattern
37, 38 inductor pattern
41-48 opening
51, 52 upper electrode pattern
60-69 opening
70-76, 79 connection pattern
77, 78 inductor pattern
81-86 opening
91-94 connection pattern
95, 96 inductor pattern
101-106 opening
111-114 connection pattern
115, 116 inductor pattern
121-124 opening
C1 first capacitor
C2 second capacitor
C3 third capacitor
C4 fourth capacitor
L1 first inductor
L2 second inductor
M1, MM, M2, M3, M4, M5 conductor layer
P plated film
R resistance pattern

What is claimed is:

1. A chip-type electronic component comprising:
   a first terminal electrode and a second terminal electrode; and
   a first conductor layer, a second conductor layer, and a third conductor layer,
   wherein the first conductor layer includes:
      a first connection pattern and a second connection pattern disposed at positions overlapping respectively the first terminal electrode and the second terminal electrode; and
      a first lower electrode pattern disposed between the first connection pattern and the second connection pattern and connected to one of the first terminal electrode and the second terminal electrode,
   wherein the second conductor layer includes a first upper electrode pattern disposed at a position overlapping the first lower electrode pattern and connected to other one of the first terminal electrode and the second terminal electrode,
   wherein the first lower electrode pattern and first upper electrode pattern form a first capacitor,
   wherein the third conductor layer includes a first inductor pattern including one end, the one end being connected to the first terminal electrode, and
   wherein the first inductor pattern includes a first section overlapping the first capacitor and a second section not overlapping the first capacitor.

2. The chip-type electronic component as claimed in claim 1, further comprising a third terminal electrode and a fourth terminal electrode,
   wherein the first conductor further includes:
      a third connection pattern and a fourth connection pattern disposed at positions overlapping respectively the third terminal electrode and the fourth terminal electrodes; and
      a second lower electrode pattern disposed between the third connection pattern and the fourth connection pattern and connected to one of the third terminal electrode and the fourth terminal electrode,
   wherein the second conductor layer further includes a second upper electrode pattern disposed at a position overlapping the second lower electrode pattern and connected to other one of the third terminal electrode and the fourth terminal electrode, wherein the second lower electrode pattern and the second upper electrode pattern form a second capacitor, wherein the third conductor layer further includes a second inductor pattern including one end, the one end being connected to the first terminal electrode, wherein other end of the first inductor pattern is connected to the third terminal electrode, and wherein other end of the second inductor pattern is connected to the fourth terminal electrode.

3. The chip-type electronic component as claimed in claim 2, wherein the second section of the first inductor pattern is partly disposed between the first connection pattern and the third connection pattern or between the second connection pattern and the fourth connection pattern.

4. The chip-type electronic component as claimed in claim 2, wherein the second inductor pattern includes a third section overlapping the second capacitor and a fourth section not overlapping the second capacitor.

5. The chip-type electronic component as claimed in claim 4, wherein the fourth section of the second inductor pattern is partly disposed between the first connection pattern and the third connection pattern or between the second connection pattern and the fourth connection pattern.

6. The chip-type electronic component as claimed in claim 3, wherein the second inductor pattern includes a third section overlapping the second capacitor and a fourth section not overlapping the second capacitor.

\* \* \* \* \*